(12) United States Patent
Dangelmaier (10) Patent No.: US 7,505,276 B2
(45) Date of Patent: Mar. 17, 2009

(54) SEMICONDUCTOR MODULE PROVIDED WITH CONTACTS EXTENDING THROUGH THE PACKAGE

(75) Inventor: Jochen Dangelmaier, Beratzhausen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 11/405,015

(22) Filed: Apr. 17, 2006

(65) Prior Publication Data

US 2006/0255458 A1 Nov. 16, 2006

Related U.S. Application Data

(63) Continuation of application No. PCT/DE2004/002201, filed on Oct. 1, 2004.

(30) Foreign Application Priority Data

Oct. 15, 2003 (DE) ................. 103 48 620

(51) Int. Cl.
*H05K 7/00* (2006.01)
(52) U.S. Cl. ...................... 361/735; 361/760
(58) Field of Classification Search ................. 361/679, 361/728, 729, 735, 736, 737, 742, 748, 760, 361/761, 764, 784, 790, 820, 301.4; 29/852; 257/735, 749, 778, 784, 698, 777, 686; 174/106 SC
See application file for complete search history.

(56) References Cited

U.S. PATENT DOCUMENTS

| 5,049,980 | A | 9/1991 | Saito et al. |
|---|---|---|---|
| 5,128,831 | A | 7/1992 | Fox, III et al. |
| 5,454,160 | A | 10/1995 | Nickel |
| 5,646,828 | A * | 7/1997 | Degani et al. ................ 361/715 |
| 5,838,061 | A | 11/1998 | Kim |
| 6,117,705 | A * | 9/2000 | Glenn et al. ................. 438/106 |
| 6,294,830 | B1 | 9/2001 | Fjelstad |
| 6,324,067 | B1 * | 11/2001 | Nishiyama .................. 361/761 |
| 6,384,472 | B1 | 5/2002 | Huang |
| 6,564,454 | B1 * | 5/2003 | Glenn et al. ................... 29/852 |
| 6,674,159 | B1 * | 1/2004 | Peterson et al. ............. 257/680 |
| 6,706,564 | B2 * | 3/2004 | Kim et al. .................... 438/125 |
| 6,853,559 | B2 * | 2/2005 | Panella et al. ............... 361/764 |
| 6,946,325 | B2 * | 9/2005 | Yean et al. ................... 438/112 |
| 7,195,940 | B2 * | 3/2007 | Bolken et al. ................. 438/25 |
| 2001/0026010 | A1 | 10/2001 | Horiuchi et al. |
| 2001/0048152 | A1 | 12/2001 | Moden et al. |
| 2002/0066952 | A1 | 6/2002 | Taniguchi et al. |
| 2003/0002260 | A1 * | 1/2003 | Hasebe et al. ................ 361/720 |

FOREIGN PATENT DOCUMENTS

| DE | 197 44 297 A1 | 4/1999 |
|---|---|---|
| EP | 0 575 051 B1 | 12/1993 |
| EP | 1154474 A1 | 11/2001 |

* cited by examiner

*Primary Examiner*—Hung S Bui
(74) *Attorney, Agent, or Firm*—Edell, Shapiro & Finnan, LLC (57) ABSTRACT

A semiconductor module includes a package, a plastic molding compound and contacts extending through the package from an underside of the package to an upper side of the package. The package includes least two layers of plastic, the first layer of plastic having external contacts and layer through contacts. A wiring structure carries the second layer of plastic, which surrounds semiconductor chips in a plastic molding compound, the contacts extending through the package being arranged in the edge regions of the semiconductor module.

18 Claims, 8 Drawing Sheets

SEMICONDUCTOR MODULE PROVIDED WITH CONTACTS EXTENDING THROUGH THE PACKAGE

CROSS REFERENCE TO RELATED APPLICATIONS

This application is a continuation of PCT/DE2004/002201, filed Oct. 1, 2004, and titled "Semiconductor Module Provided with Contacts Extending Through the Housing," which claims priority to German Application No. DE 10348620.8, filed on Oct. 15, 2003, and titled "Semiconductor Module Provided with Contacts Extending Through the Package," the entire contents of which are hereby incorporated by reference.

FIELD OF THE INVENTION

The invention relates to a semiconductor module with a package, a plastic molding compound, and contacts extending through the package from an underside of the package to an upper side of the package, the underside of the package having external contact areas.

BACKGROUND

Semiconductor modules are packaged in types of packages such as flat lead packages or flat leadless packages, such as P-TSLP packages or P-UFLGA packages. These types of package typically have no contacts extending through the package. Such packages, in particular the P-TSLP packages and the P-UFLGA packages, additionally have the disadvantage that external contact structures and flat leads are produced by complex etching processes, and wiring leads are created by etching down flat leads. Close tolerances are consequently not feasible and the co-planarity of the external structures is difficult to achieve. The low reproducibility when etching out external contact structures, and in particular when etching down wiring leads, causes an unacceptable reject rate in the fabrication of such components. Furthermore, a high degree of growth is observed in edge regions during the etching down.

SUMMARY

The invention provides a semiconductor module with a package which promises a reduced reject rate in fabrication, permits reliable improved reproducibility of the package structure, and allows simplified assembly of the components of a semiconductor module. According to the invention, a semiconductor module with a package and a plastic molding compound and contacts extending through the package from an underside of the package to an upper side of the package is provided, the underside of the package having external contact areas of external contacts. These external contacts are embedded in a first layer of plastic of the package, apart from the external contact areas. In addition to the embedded external contacts, the first layer of plastic of the package has contacts extending through the layer to the external contacts. The upper sides of the layer through contacts and the upper side of the first layer of plastic form a common coplanar upper side.

Arranged on this coplanar upper side is a wiring structure with wiring leads and contact terminal areas. Arranged on the contact terminal areas are terminals of semiconductor chips, the semiconductor chips being surrounded by a second layer of plastic of the package. In the second layer of plastic there extend contacts extending through the package, from the wiring structure to the upper side of the second layer of plastic. The upper sides of the contacts extending through the package form a further coplanar upper side with the upper side of the second layer of plastic.

Such a component, which is made up of at least two layers of plastic, has the advantage that it can be assembled by conventional fabrication steps. In addition, it has the advantage that the contacts extending through the package can be applied in a serial way or in parallel for a multiplicity of semiconductor modules at the same time and the wiring structure on the coplanar upper side. The formation of a further coplanar upper side from the upper sides of the contacts extending through the package and the upper side of the second layer of plastic makes it possible to test the semiconductor module from this further coplanar upper side, by accessing the contacts extending through the package. In this case, the external contact areas on the underside of the package are spared and damage to the external contact areas on the underside of the package during testing is avoided.

A further advantage of the layered structure of the package comprising a first layer of plastic with external contacts and a second layer of plastic with the semiconductor chips additionally has the advantage that the contacting of the semiconductor chips can take place both with flip-chip contacts and by bonding connections. Accordingly, the wiring structure which can be applied to the first coplanar upper side is adapted to the type of contacting of the semiconductor chips. A further advantage of this electronic component which has two semiconductor layers arranged one on top of the other is that only one wiring structure is required for constructing the semiconductor module. This wiring structure has wiring leads between contact terminal areas and upper sides of contacts extending through the layer, and between contact terminal areas and undersides of contacts extending through the package. A simple wiring structure such as this merely requires a single structuring step of a metal layer on a coplanar upper side of the first layer of plastic of the semiconductor module.

In a further embodiment of the invention, the contacts extending through the package are formed by contact pieces extending through the package, which together with the semiconductor chips are embedded in the second layer of plastic. This has the advantage that the wiring layer on the coplanar upper side of the first layer of plastic can be loaded with the semiconductor chips and the contacts extending through the package in one operation, before these components of the semiconductor module are embedded in the second layer of plastic.

In a further aspect of the invention, it is provided that the second layer of plastic surrounds the cavity in which the semiconductor chips are arranged. The coplanar further upper side of the second layer of plastic is closed off by a covering, at least in the region of the cavity.

Such a covering on the upper side of the package may comprise a ceramic, plastic or metal. A covering made of metal or metal-clad ceramic or metal-coated plastic may be advantageously connected via a contact extending through the package to a ground potential, which is connected on the underside of the package to an external contact area. A covering made of ceramic or plastic is advantageously used whenever a number of contacts extending through the package with different electric potential are arranged on the side walls of the cavity up to the further coplanar upper side of the second layer of plastic or of the package.

The cavity package of the further aspect of the invention has the advantage that the semiconductor chips are not in contact with the second layer of plastic, so that the semiconductor module can be used for radio-frequency applications, since the cutoff frequency is not reduced by the second layer of plastic. Furthermore, a metallic covering made of metal or metal-clad ceramic can be used to achieve electromagnetic shielding, which is of advantage in particular for radio-frequency applications.

With a further aspect of the invention, it is provided that the covering and/or the first layer of plastic have a transparent region, which is aligned with respect to a sensitive side of a sensor chip. In the case of the first layer of plastic, the transparent region may be formed by a transparent plate or lens which is encapsulated by the first layer of plastic.

In the case of the covering with a transparent region, this region may comprise an opening in the covering which is taken up or covered by a transparent material. These transparent regions have the advantage that the second layer of plastic may have optical sensors, which have for example an optical emitting or receiving function if the semiconductor module is to be used as an optocoupler.

Furthermore, it is possible to design the side walls of the cavity such that they have steps. The steps may have contact terminal areas which are in connection with active upper sides of semiconductor chips. In particular, stacked semiconductor chips may be arranged on the semiconductor chips which are arranged on the wiring layer. The stacked semiconductor chips may be connected via the contact terminal areas of the steps and the contacts extending through the package to external contacts of the first layer of plastic on the underside of the package. Contact areas of the semiconductor chips arranged on the first wiring layer that have the same potentials as the contact areas of the stacked semiconductor chips may be short-circuited via the contacts extending through the package. These contacts extending through the package are arranged on the side walls of the cavity and can be produced by microelectromechanical technologies (MEM technologies).

In embodiments of the invention mentioned above, the semiconductor chip can have flip-chip contacts, which are arranged on the contact terminal areas of the wiring structure. In the case of such a structure, the active upper sides of the semiconductor chips are aligned in the direction of the wiring structure and consequently in the direction of the first coplanar upper side. Using wiring leads of this wiring structure, both external contacts and contact pieces extending through the package can be connected to one another via interconnects. However, it must be ensured that the edge region of the first layer of plastic remains free of wiring leads.

The contact pieces extending through the package are preferably arranged in this edge region, especially since their number can thereby be maximized. This number of the contact pieces extending through the package may correspond to the number of external contacts, being accompanied by the advantage that each of the external contacts can still be accessed from the upper side of the semiconductor module via the contact pieces extending through the package even after surface-mounting installation of the semiconductor module in a higher-level circuit arrangement. Due to the wiring structure, it is possible that the external contact areas can be arranged in the form of a matrix, distributed over the entire underside of the package, while the upper sides of the contact pieces extending through the package that are located on the upper side of the semiconductor module are merely arranged in the edge region of the semiconductor module.

In a further embodiment of the invention, it is provided that the semiconductor chips of the semiconductor module have contact areas on the active upper sides. The corresponding back sides of the semiconductor chips are arranged directly on the wiring structure, so that the active upper sides of the semiconductor chips are accessible from above before embedding in a second layer of plastic. In this case, contact terminal areas are provided in the wiring structure outside the areas required for the back sides of the semiconductor chips. The contact terminal areas of the wiring structure are connected to the contact areas on the active upper side of the semiconductor chips by bonding wires. In the case of this embodiment of the invention, not only are the semiconductor chips of the semiconductor module embedded in the second layer of plastic, but also the bonding wires for the connection of the active upper sides to the wiring structure are surrounded by the second plastic molding compound.

Furthermore, it is possible again to apply to the second coplanar upper side a wiring structure, which is in connection via interconnects with the upper sides of the contact pieces extending through the package. This allows further semiconductor chips to be stacked on the second layer of plastic, which are embedded in a third layer of plastic and are electrically in connection with the other semiconductor chips of the semiconductor module by wiring leads and contact pieces extending through the package. On the basis of the principles according to the invention of the structuring, any number of layers of plastic with semiconductor chips can be stacked one on top of the other, the upper sides of the layers, apart from that of the uppermost layer, in each case having wiring structures, on which semiconductor chips of the next-higher layer of plastic are arranged. The contact pieces extending through the package may for this purpose be arranged in layers and columns one on top of the other, so that common contacts extending through the package are formed in an advantageous way, reaching from the external contact areas on the underside of the semiconductor module up to the upper side of the package of the semiconductor module.

Apart from stacking semiconductor chips in the vertical direction, a panel may also be provided, having semiconductor module positions with semiconductor modules arranged in rows and columns, in a way corresponding to the embodiments above. Such a panel has the advantage that fabrication steps can be performed simultaneously, i.e., in parallel, for a plurality of semiconductor modules, and consequently for a plurality of semiconductor module positions.

A method for producing a semiconductor module is as follows. Firstly, an auxiliary carrier with a number of semiconductor module positions is provided. After that, external contacts are deposited on the auxiliary carrier in the semiconductor module positions. Finally, the auxiliary carrier is coated in the semiconductor module positions with plastic, thereby embedding the external contacts. In this way, a continuous upper side of plastic is created for a number of semiconductor module positions.

Further, upper sides of the external contacts are then uncovered by removing the layer of plastic from the external contacts. The uncovered regions may be filled with contacts passing through the layer by depositing metal in the uncovered regions. They may also likewise be mechanically contacted when a wiring structure which extends over a wiring position is formed. The semiconductor chips of a module can then be applied to such a wiring structure when electrical connections between semiconductor chips and the wiring structure are produced.

Subsequently, the contacts extending through the package are placed onto the wiring structure and a second layer of plastic is applied, embedding the semiconductor chips and encapsulating the circumferential surfaces of the contact pieces extending through the package. In this case, the upper side of the contact pieces extending through the package remains free from plastic or is freed of any accumulations of plastic possibly applied after application of the plastic. Following curing of the second layer of plastic, a self-supporting composite sheet is formed, from which the auxiliary carrier can then be removed, thereby forming a panel with a number of component positions. Subsequently, the composite sheet or this panel can be cut up into individual semiconductor modules.

This method has the advantage that a high proportion of method steps can be performed simultaneously in parallel for a number of semiconductor modules. This applies in particular to the depositing of the external contacts, to the application of the first layer of plastic, to the application of the first wiring structure and to the encapsulating or embedding of a first layer of semiconductor chips in a second plastic molding compound. The semiconductor chips themselves, and possibly also the contact pieces extending through, may be applied in series, having to be individually adjusted in the individual chip positions and in the positions of the contact pieces extending through the package. This series fabrication may, however, be transformed into parallel production and fabrication by using corresponding stencils and, in particular, by using semiconductor chips with flip-chip contacts.

A further variant of the method provides that, even before the panel is cut up into individual semiconductor modules, a second wiring structure with semiconductor chips and contact pieces extending through the package is applied to the coplanar upper side of the second layer of plastic and a third layer of plastic embeds the semiconductor chips and encapsulates the circumferential surfaces of the contact pieces extending through the package. It is ensured here that the upper side of this third layer of plastic forms a common third coplanar upper side with the upper sides of the contact pieces extending through the package. This third coplanar upper side may in turn be the starting point for further layers of plastic.

One advantage of this method is consequently that any number of layers of plastic with embedded semiconductor chips can be realized, by repeating n times the method steps of applying a wiring structure with semiconductor chips and contact pieces extending through the package and applying a layer of plastic, thereby producing a coplanar upper side for n layers of plastic stacked one on top of the other, before cutting-up of the panel into semiconductor modules takes place.

In one embodiment of the invention, the auxiliary carrier to be removed may be a metal-clad film, a metal-clad sheet or metal plates or metal foils, which are separated from the composites comprising plastic and semiconductor chips before the cutting-up of individual semiconductor modules. To apply external contacts, the auxiliary carrier may firstly be produced with an insulating layer, while leaving the external contact areas free, and then the external contacts are subsequently electrodeposited or chemically deposited on the areas left free. This variant of the method has the advantage that an equally high number of external contacts can be created on an auxiliary carrier.

Instead of a metal-clad or a metallic auxiliary carrier, films of plastic or sheets of plastic may also be used. In this case, it is of advantage to print the external contacts onto the auxiliary carrier by means of stencil printing or screen printing. For this purpose, metal pastes are used, sintered together in a subsequent sintering process to form metallic external contacts. The electrical connection between the semiconductor chips and the wiring structure may take place either by bonding wires or by using semiconductor chips with flip-chip contacts. Application of the layers of plastic may take place by molding or by dispensing, in order in each case to form coplanar upper sides of plastic and upper sides of the contact pieces extending through the package.

Wiring structures on such a coplanar upper side may be prepared by depositing a continuous layer of metal or by vapor-depositing the same, this continuous metal layer being photolithographically structured. On the other hand, it is also possible to apply already fully structured wiring layers to the coplanar upper sides.

The application of the contact pieces extending through the package may take place in parallel by electrodepositing or chemical depositing, appropriate covering layers protecting the other areas from having contact pieces extending through the package applied to them. The connection between the individual contact pieces extending through the package of the respective layers of plastic may take place by soldering or with the aid of conductive adhesives if electrodepositing or chemical depositing on the respectively underlying contact pieces extending through the package is not envisaged.

To summarize, the first layer of plastic, i.e., the embedding of the external contacts, is accompanied by the advantage that these external contacts already make the customer footprint possible, i.e., the surface-mountable arrangement of external contacts desired by the customer on the underside of the package, and in addition, independently of this, allow contacts extending through the package to be created in the edge regions. These first external contacts are covered according to the invention by first molding. Subsequently, through-openings to the external contacts for subsequent plastic metallization are created, for example by laser. This plastic metallization may bring about both the filling of the contacts extending through and the creation of the wiring structure. To make it possible for a number of layers of semiconductor chips to be stacked later, metallic pins or pieces of wire are introduced into the encapsulating layer of plastic in the form of vertical contacts to bridge the differences in heights of the contact pieces extending through the package.

After encapsulating with a plastic molding compound, it may be necessary for the contact pieces extending through the package or vertical contacts to be uncovered once again, in order to allow the next metallization to be applied for a further wiring structure. Due to the structure of the semiconductor module according to the invention, it is advantageously possible to isolate the geometry of the external contacts on the underside from the geometry of the semiconductor chip contacts. A further advantage is the stacking of semiconductor chips in a complete package, as well as the saving of costs brought about by repeated process steps. In addition, greater reliability and reproducibility is obtained in the production of such semiconductor modules.

BRIEF DESCRIPTION OF THE DRAWINGS

The invention is now explained in more detail on the basis of the accompanying figures.

DETAILED DESCRIPTION

Figure 1:
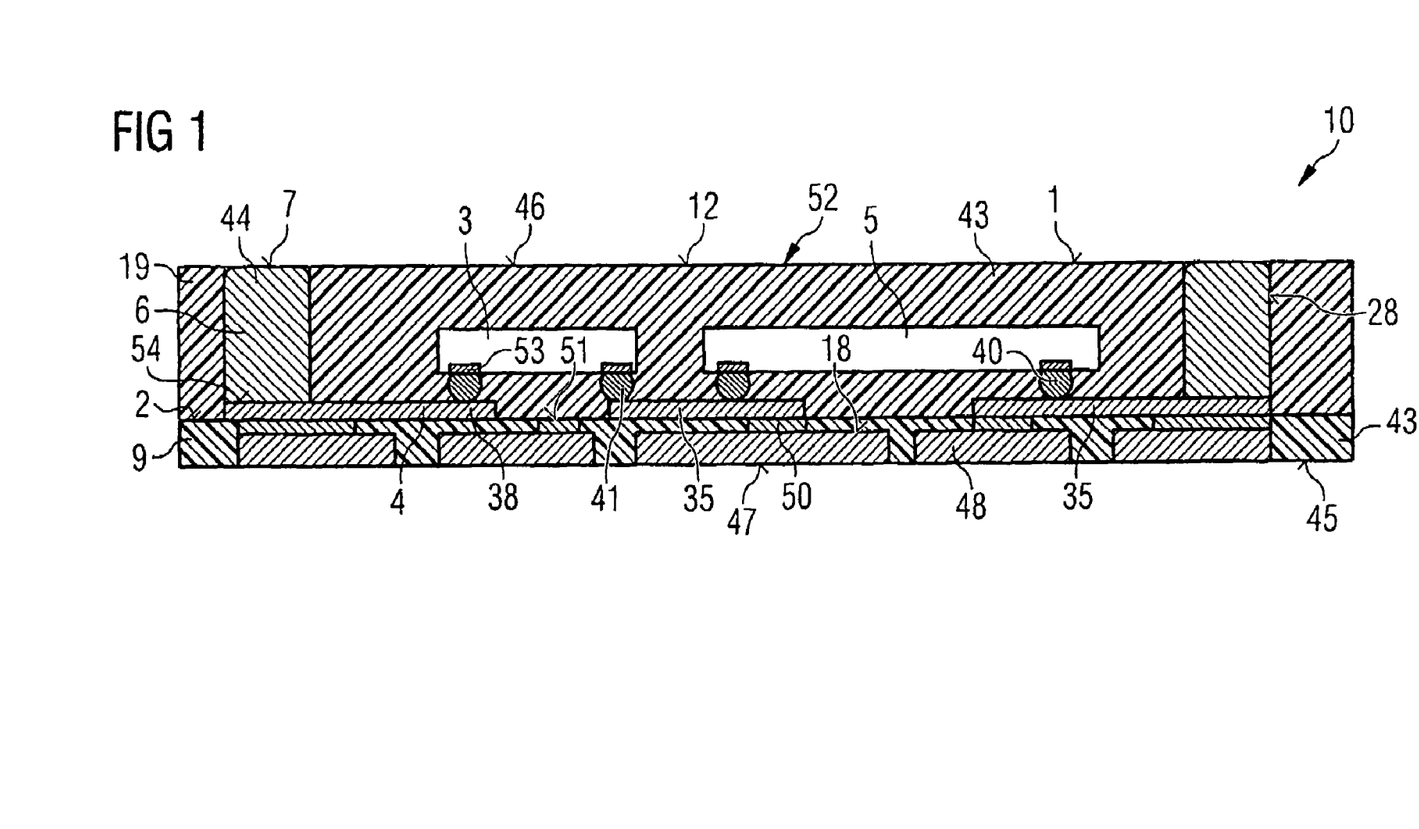
FIG. 1 shows a schematic cross section through a semiconductor module of a first embodiment of the invention.

FIG. 1 shows a schematic cross section through a semiconductor module 10 of a first embodiment of the invention. The semiconductor module 10 is made up of two layers of plastic 9 and 19. The lower layer of plastic 9 has external contacts 48 with external contact areas 47. Furthermore, the first layer of plastic 9 has layer through contacts 50 that have upper sides 51, which are aligned such that they are coplanar with respect to the upper side 2 of the first layer of plastic 9. Arranged on this common upper side, which is formed by the upper sides 51 of the contacts 50 extending through the layer and by the upper side 2 of the first layer of plastic 9, is a wiring structure 4.

The second layer of plastic 19 has in this schematic cross section two embedded semiconductor chips 3 and 5, which have flip-chip contacts 41, which connect the connection between contact areas 53 on the active upper sides of the semiconductor chips 3 and 5 to contacts terminal areas 38 of the wiring structure 4. Arranged in the edge regions of the semiconductor module 10 on the wiring structure 4 are contact pieces 6 extending through the package, the undersides 54 of which rest on corresponding areas of the wiring structure 4 and are electrically connected to them. The circumferential surfaces 28 of the contact pieces 6 extending through the package are encapsulated by the plastic molding compound 43. The upper sides 7 of the contact pieces 6 extending through the package form with the upper side 12 of the second layer of plastic 19 a first coplanar upper side 1, which at the same time represents the upper side 46 of the package.

This arrangement allows the semiconductor module 10 to be tested from the upper side 46 of the package with the aid of the contact pieces 6 extending through the package, without the external contact areas 47 of the external contacts 48 having to be touched by probing tips. The external contacts 48 are evenly distributed on the underside 45 of the package, while the corresponding contact pieces 6 extending through the package are arranged at predetermined intervals in the edge region of the semiconductor module 10. Consequently, sufficient space remains between the contact pieces 6 extending through the package for positioning and contacting of the semiconductor chips 3 and 5. At the same time, the contact pieces 6 extending through the package provide that complete embedding of the semiconductor chips 3 and 5 in the second layer of plastic 19 is ensured when the second layer of plastic 19 is applied by molding or dispensing. This produces a first coplanar upper side 1, which in this first embodiment of the invention at the same time forms the upper side 46 of the package. The layers of plastic 9 and 19 form the package 52 of the semiconductor module 10.

In order to produce such a semiconductor module 10, firstly a number of semiconductor modules may be produced in a contiguous panel comprising two layers of plastic stacked one on top of the other. In this case, the fabrication steps are performed simultaneously, and consequently in parallel, for a number of semiconductor modules. Only after completion of a panel with a number of semiconductor modules is the panel then divided up, so that a semiconductor module 10, as shown in FIG. 1, is obtained. On the other hand, the first coplanar upper side 1 may also be used in turn to apply a wiring structure 4 to this first coplanar upper side 1.

Figure 2:
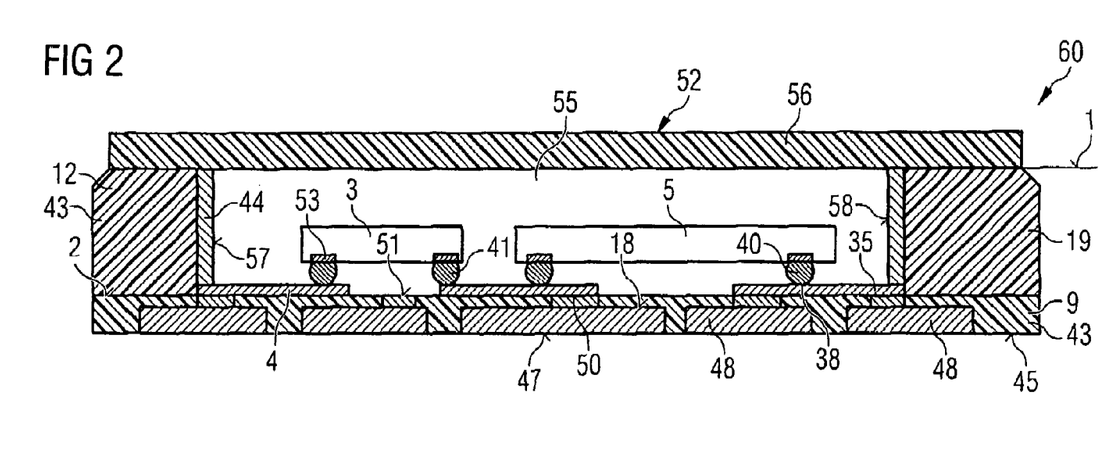
FIG. 2 shows a schematic cross section through a semiconductor module of a second embodiment of the invention.

FIG. 2 shows a schematic cross section through a semiconductor module 60 of a second embodiment of the invention; components with the same functions as in FIG. 1 are identified by the same designations and not separately explained.

In the second embodiment of the invention, the semiconductor chips 3 and 5 are arranged in a cavity 55, which is formed by the second layer of plastic 19 and consequently represents a cavity package frame, which on its upper side forms with the contacts 44 extending through the package a coplanar upper side 1. The contacts 44 extending through the package are arranged on the side walls 57 and 58 of the cavity 55 by a microelectromechanical technology and can be connected via an individual external contact 48 to a ground potential or via a number of external contacts 48 to different signal potentials.

The cavity 55 is closed off by a covering 56, which may be formed as a shielding, and is then likewise in connection with a ground potential via a contact 44 extending through the package. Such a shielding covering is provided for semiconductor modules in radio-frequency operation. On the other hand, it is also possible to use an insulating covering 56 if different signal potentials are carried by the contacts 44 extending through the package along the side walls 57 and 58 of the cavity to the upper side of the package.

Figure 3:
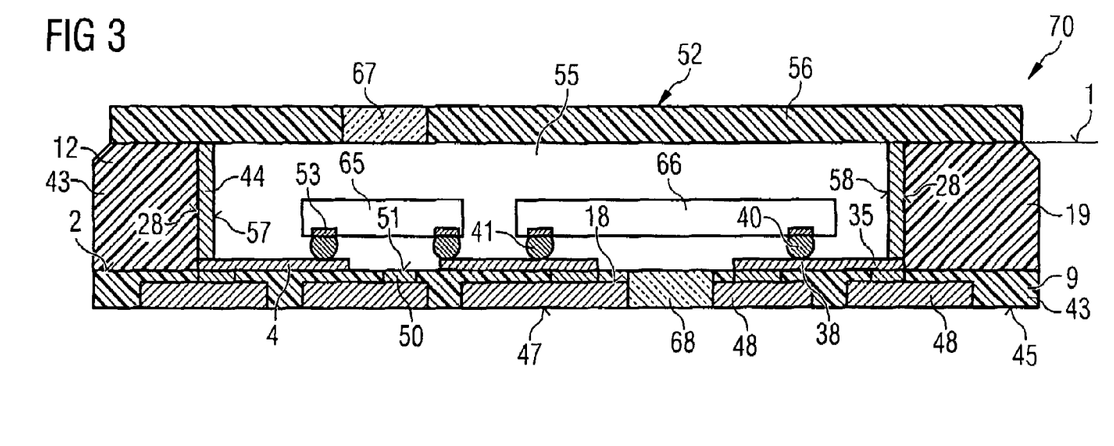
FIG. 3 shows a schematic cross section through a semiconductor module of a third embodiment of the invention.

FIG. 3 shows a schematic cross section through a semiconductor module 70 of a third embodiment of the invention. Components with the same functions as in the previous figures are identified by the same designations and not separately explained.

The semiconductor module 70 of this third embodiment of the invention has in the covering 56 on the upper side 46 of the package 52, above the semiconductor chip 65, a transparent region 67, which corresponds to a sensitive back side of the semiconductor chip 65, so that the optical signals which act on the sensitive region can be detected and evaluated by the semiconductor chip 65. In addition, the first layer of plastic 9 has a transparent region 68 on the underside 45 of the package 52, which with the active upper sides of the semiconductor chips 65 and 66 forms an optical emitter or an optical sensor, so that the semiconductor module 70 can be used as an optocoupler.

Figure 4:
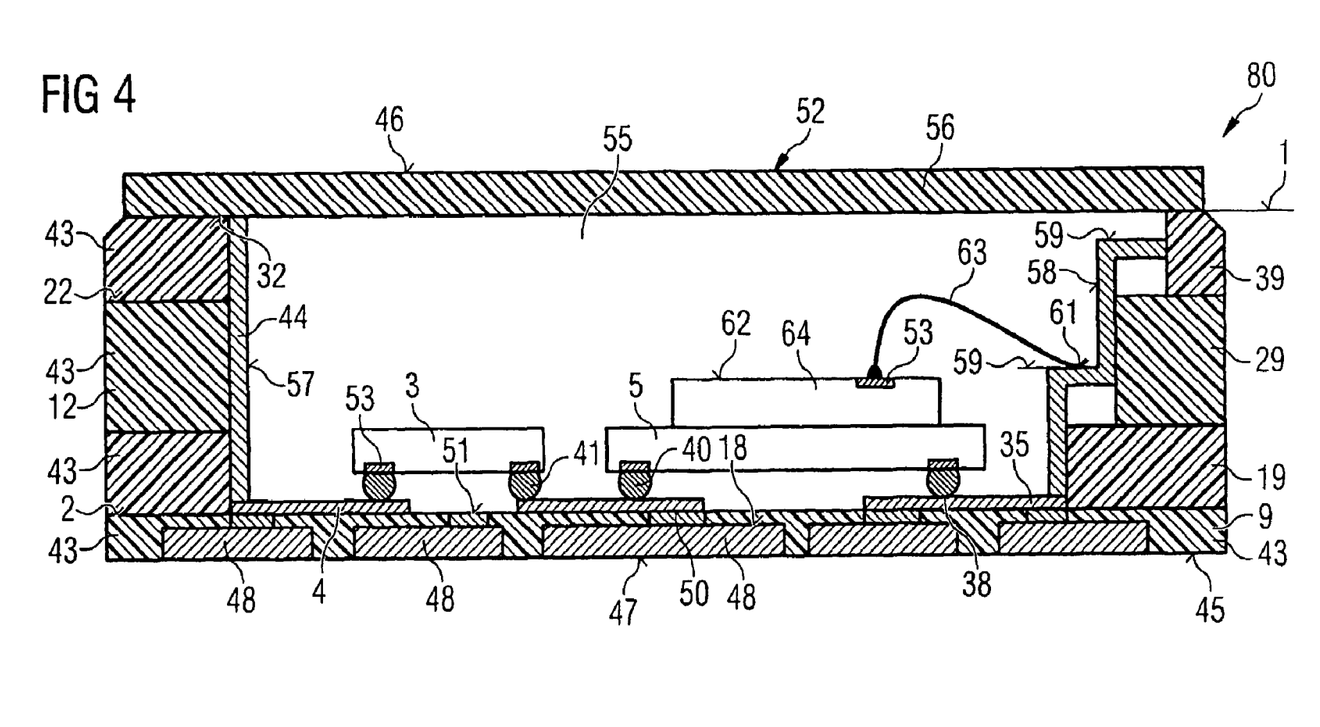
FIG. 4 shows a schematic cross section through a semiconductor module of a fourth embodiment of the invention.

FIG. 4 shows a schematic cross section through a semiconductor module 80 of a fourth embodiment of the invention. Components with the same functions as in the previous figures are identified by the same designations and not separately explained.

The semiconductor module 80 of the fourth embodiment of the invention has four layers of plastic 9, 19, 29 and 39 of a plastic package molding compound 43. The layers of plastic 19, 29, 39 surround a cavity 55 in which a semiconductor chip 3 and a stack comprising the semiconductor chips 5 and 64 are arranged. The inner wall 58 of the cavity 55 has a step 59 with a contact terminal area 61, which is electrically connected to a contact area 53 of the active upper side 62 of the stack semiconductor chip 64 by a bonding connection 63. The inner wall 57, on the other hand, is not stepped and has a contact 44 extending through the package, which connects the underside 45 of the package 52 to the upper side 46 of the package 52. This upper side 46 is shielded by a metallic covering 56, which lies at ground potential via the contact 44 extending through the package with an external contact 48.

Figure 5:
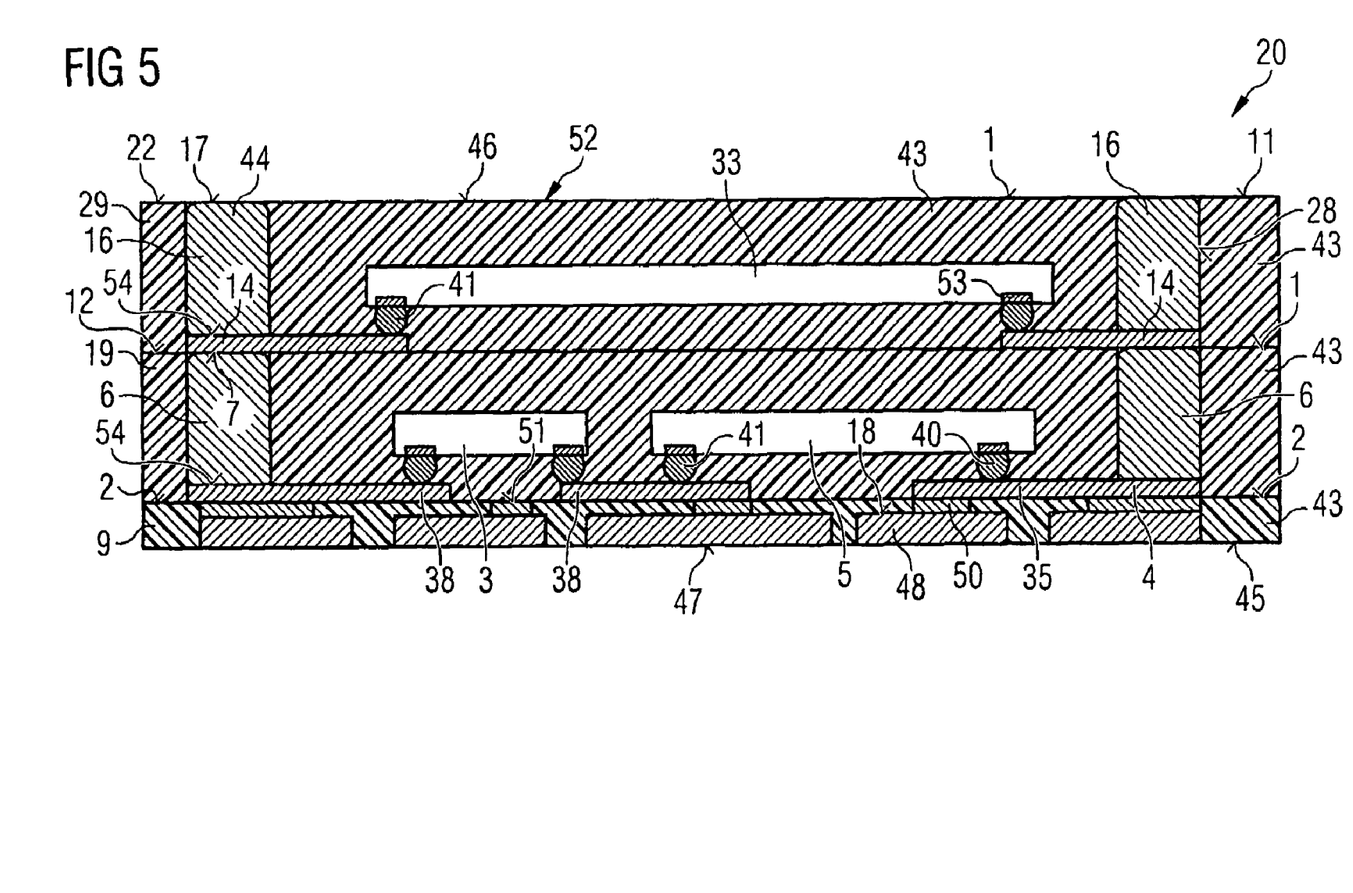
FIG. 5 shows a schematic cross section through a semiconductor module of a fifth embodiment of the invention.

FIG. 5 shows a schematic cross section through a semiconductor module 20 of a fifth embodiment of the invention. Components with the same functions as in the previous figures are identified by the same designations and not separately explained.

In contrast with the semiconductor module according to FIG. 1, the semiconductor module 20 has three layers of plastic 9, 19 and 29, which are stacked one on top of the other. In this case, both the first layer of plastic 9 and the second layer of plastic 19 are identically structured, as in FIG. 1. However, a second wiring structure 14 is additionally applied to the first coplanar upper side 1. The second wiring structure 14 has contact terminal areas for electrical connections to a further semiconductor chip 33. Such a semiconductor chip 33 may be a memory chip, while the semiconductor chips 3 and 5 embedded in the second layer of plastic 19 are in each case logic chips.

The second wiring structure 14, like the first wiring structure 4, has wiring leads 35, which lead in the third layer of plastic 29 to contact terminal areas and connect these contact terminal areas to second contact pieces 16 extending through the package, which are arranged in the edge region of the third layer of plastic 29. The plastic molding compounds 43 of the first, second and third layers of plastic 9, 19 and 29 may be of the same plastics material. In an embodiment shown here, however, the material of the first layer of plastic 9 is different from the two layers of plastic 19 and 29 lying over it and consists of polyamide, while the plastic molding compounds 43 of the second and third layers of plastic 19 and 29 are produced from a differently filled epoxy resin.

The contact pieces 6 and 16 respectively extending through the package of the second and third layers of plastic 19 and 29 are arranged one on top of the other such that they form a common contact 44 extending through the package. The upper sides 17 of the contacts 44 extending through the package and the upper side 22 of the third layer of plastic 29 form a second coplanar upper side 11. The second coplanar upper side 11 is at the same time the upper side 46 of the package of the semiconductor module 20. Both in the first embodiment and in the second embodiment, semiconductor chips which have flip-chip contacts 41 are used. This creates terminals 40 of semiconductor chips that can be soldered onto the contact terminal areas 38 of the wiring structures 4 or 14 in a parallel fabrication step.

Figure 6:
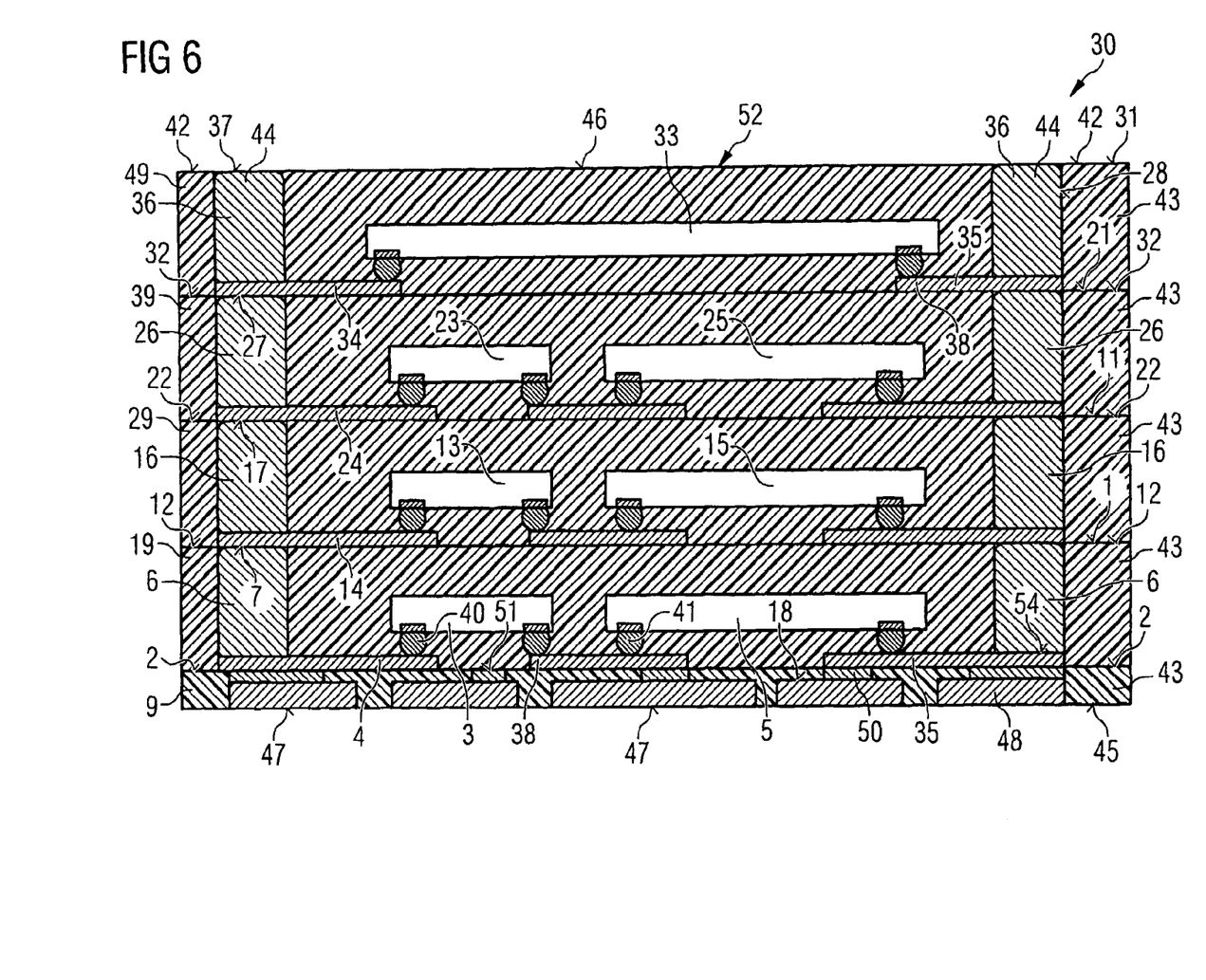
FIG. 6 shows a schematic cross section through a semiconductor module of a sixth embodiment of the invention.

FIG. 6 shows a schematic cross section through a semiconductor module 30 of a sixth embodiment of the invention. Components with the same functions as in the previous figures are identified by the same designations and not separately explained.

In the case of the sixth embodiment of the invention, four layers of plastic 19, 29, 39, and 49, which respectively have semiconductor chips 3, 5; 13, 15; 23, 25; and 33, are stacked one on top of the other. In addition, this semiconductor module 30 of the sixth embodiment of the invention has four wiring structures 4, 14, 24, and 34. The wiring structures 14, 24, and 34 are arranged on coplanar upper sides 1, 11, and 21 from the upper sides 7, 17, and 27 of the contact pieces 6, 16, and 26 extending through the package and the upper sides 12, 22, and 32 of the layers of plastic 19, 29, and 39. Four contact pieces 6, 16, 26 and 36 extending through the package and stacked one on top of the other together form a contact 44 extending through the package. The contact pieces 6, 16, 26, and 36 extending through the package are soldered in each of the layers of plastic 19, 29, 39, and 49 on corresponding areas of the wiring structures 4, 14, 24, and 34.

The upper side 46 of the package is in turn a coplanar upper side 31 from the upper sides 37 of the fourth contact pieces 36 extending through the package and the upper side 42 of the uppermost layer of plastic 49. The schematic cross section shown in FIG. 6 is not to scale, but rather the thickness of each of the layers of plastic 19, 29, 39 and 49, which receive corresponding semiconductor chips 3, 5; 13, 15; and 23, 25 as well as 33, is dependent on the thickness of the semiconductor chips. The thickness of the semiconductor chips lies between 70 and 350 µm. The thicknesses of the layers of plastic 19, 29, 39, and 49 accordingly lie between 100 and 500 µm. Correspondingly, an overall thickness of the semiconductor module 30 of the sixth embodiment of the invention of between approximately 0.5 and 3 mm is obtained. The base area of the semi-conductor module 30 on the other hand may be several cm$^2$. On this area, which is large in relation to the thickness, a correspondingly high number of external contact areas can be accommodated. The schematic cross section shown here is consequently in stark contrast to the true dimensions of the semiconductor module.

FIGS. 7 to 12 show schematic cross sections through intermediate products after performing individual fabrication steps for producing a semiconductor module 10, as it is shown in FIG. 1.

Figure 7:
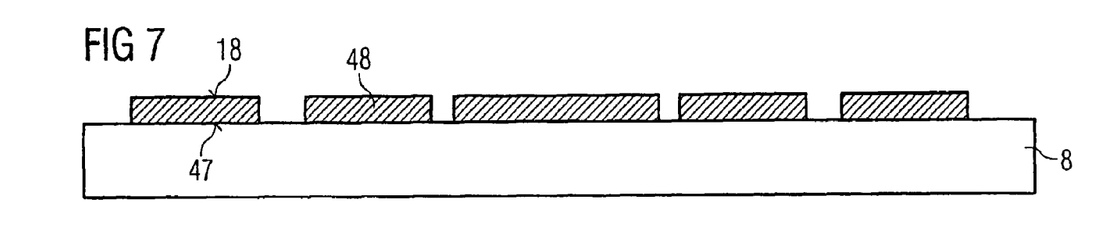
FIG. 7 shows a schematic cross section through an auxiliary carrier after application of external contacts.

FIG. 7 shows a schematic cross section through an auxiliary carrier 8 after applying external contacts 48. In this embodiment of the invention, the auxiliary carrier 8 is a metal foil, on which firstly a photolithographic layer has been applied and structured. Subsequently, the external contacts 48 shown here are deposited with their upper sides 18 in an electrolytic bath. After the electrodeposition of the external contacts 48, the photolithographic layer is then removed by plasma ashing or by dissolving the photoresist in a corresponding solvent.

Figure 8:
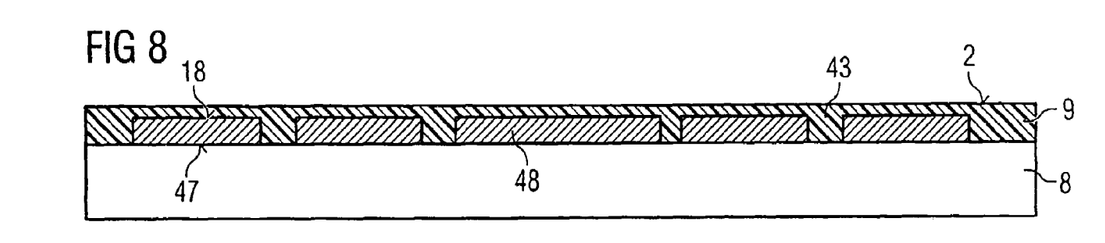
FIG. 8 shows a schematic cross section through an auxiliary carrier according to FIG. 7 after application of a first layer of plastic.

FIG. 8 shows a schematic cross section through an auxiliary carrier 8 according to FIG. 7, after applying a first layer of plastic 9. The first layer of plastic 9 in this embodiment of the invention is a plastic molding compound 43, which comprises polyamide. The free areas shown in FIG. 4, and in particular the upper sides 18 of the external contacts 48, are completely encapsulated by the plastic molding compound 43. At the same time, a planar upper side 2 of the first layer of plastic 9 is formed.

Figure 9:
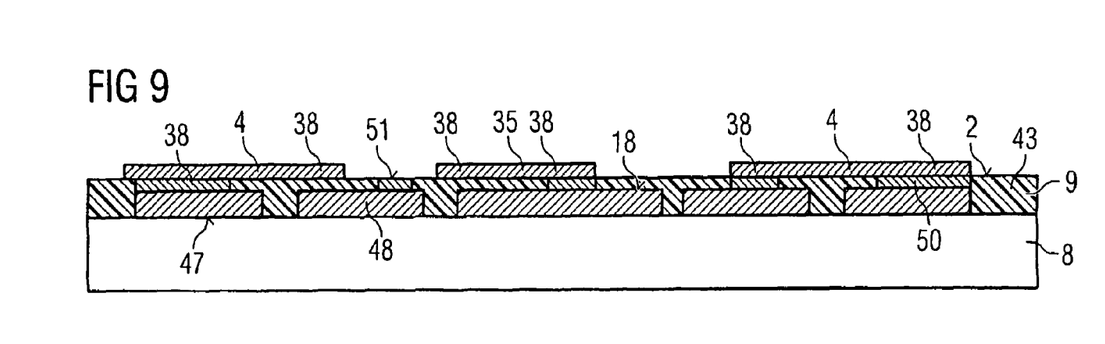
FIG. 9 shows a schematic cross section through an auxiliary carrier according to FIG. 8 after application of contacts extending through the layer and a wiring structure.

FIG. 9 shows a schematic cross section through an auxiliary carrier 8 according to FIG. 8, after applying contacts 50 extending through the layer and a wiring structure 4. To apply the contacts 50 extending through the layer, the upper side 2 of the first layer of plastic 9 is opened at corresponding locations. This structured opening may take place by masking the upper side 2 of the first layer of plastic 9 and subsequently dissolving out the plastic in the region of the openings of the mask. In the embodiment as it is shown in FIG. 6, however, the openings for introducing the contacts 50 extending through the layer are produced by laser ablation. When the wiring structures 4 are subsequently produced, wiring leads 35 and contact terminal areas 38 with the wiring structure 4 are formed on one side.

Figure 10:
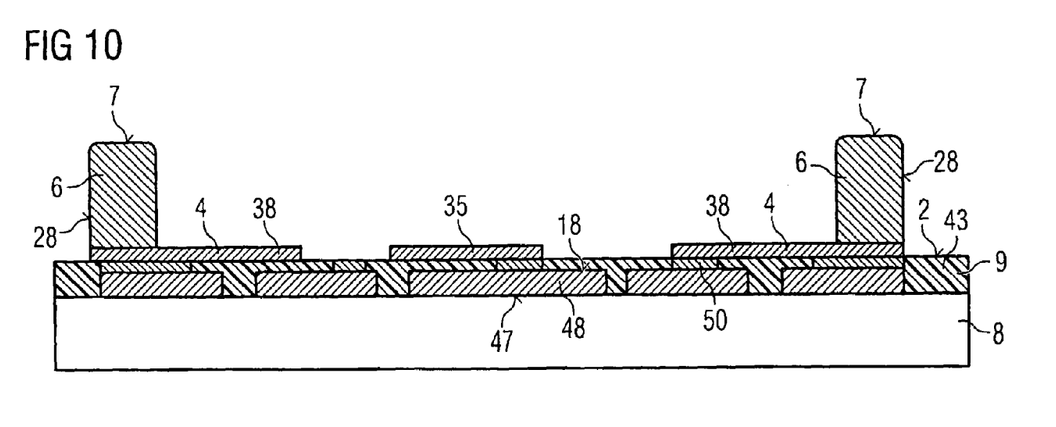
FIG. 10 shows a schematic cross section through an auxiliary carrier according to FIG. 9 after application of contact pieces extending through the package.

FIG. 10 shows a schematic cross section through an auxiliary carrier 8 according to FIG. 9, after applying contact pieces 6 extending through the package to the wiring structure 4. These contact pieces 6 extending through the package are on the one hand in electrical connection with the external contacts 48 via the contacts 50 extending through the layer and on the other hand may be formed either by electrodeposition on the wiring structure 4 or by placing the contact pieces 6 extending through the package onto the corresponding areas of the wiring structure 4 in the edge regions of the auxiliary carrier 8 and soldering them in place. The contact pieces 6 extending through the package are consequently arranged around a center which is intended for semiconductor chips of the semiconductor module.

Figure 11:
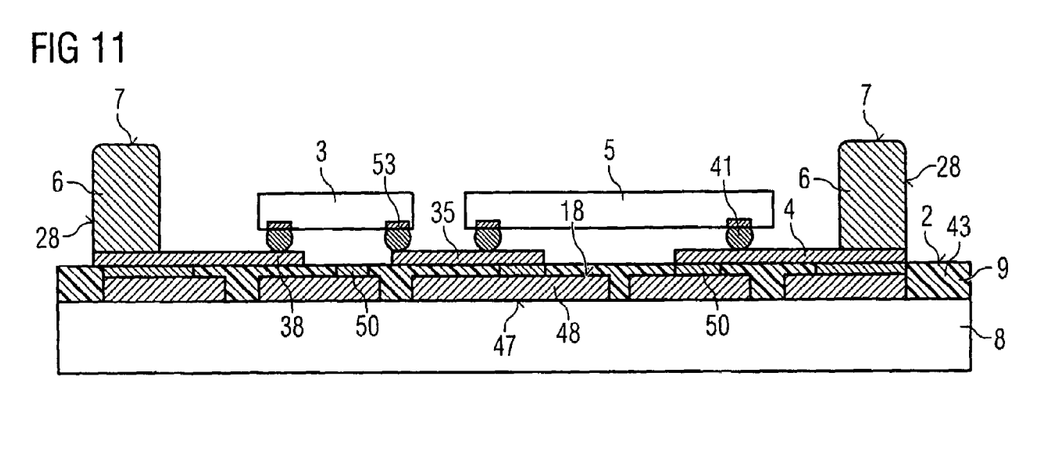
FIG. 11 shows a schematic cross section through an auxiliary carrier according to FIG. 10 after application of semiconductor chips.

FIG. 11 shows a schematic cross section through an auxiliary carrier 8, according to FIG. 10, after applying semiconductor chips 3 and 5. The semiconductor chips 3 and 5 have flip-chip contacts 41, which are provided on corresponding contact areas 53 of the active upper sides of the semiconductor chips 3 and 5. The flip-chip contacts 41 are soldered onto the contact terminal areas 38 provided in the wiring structure 4. Consequently, the contact areas 53 of the semiconductor chips 3 and 5 are electrically connected via the flip-chip contacts 41, the contact terminal areas 38 and the wiring leads 35 both to the external contacts 48 and to the contact pieces 6 extending through the package.

Figure 12:
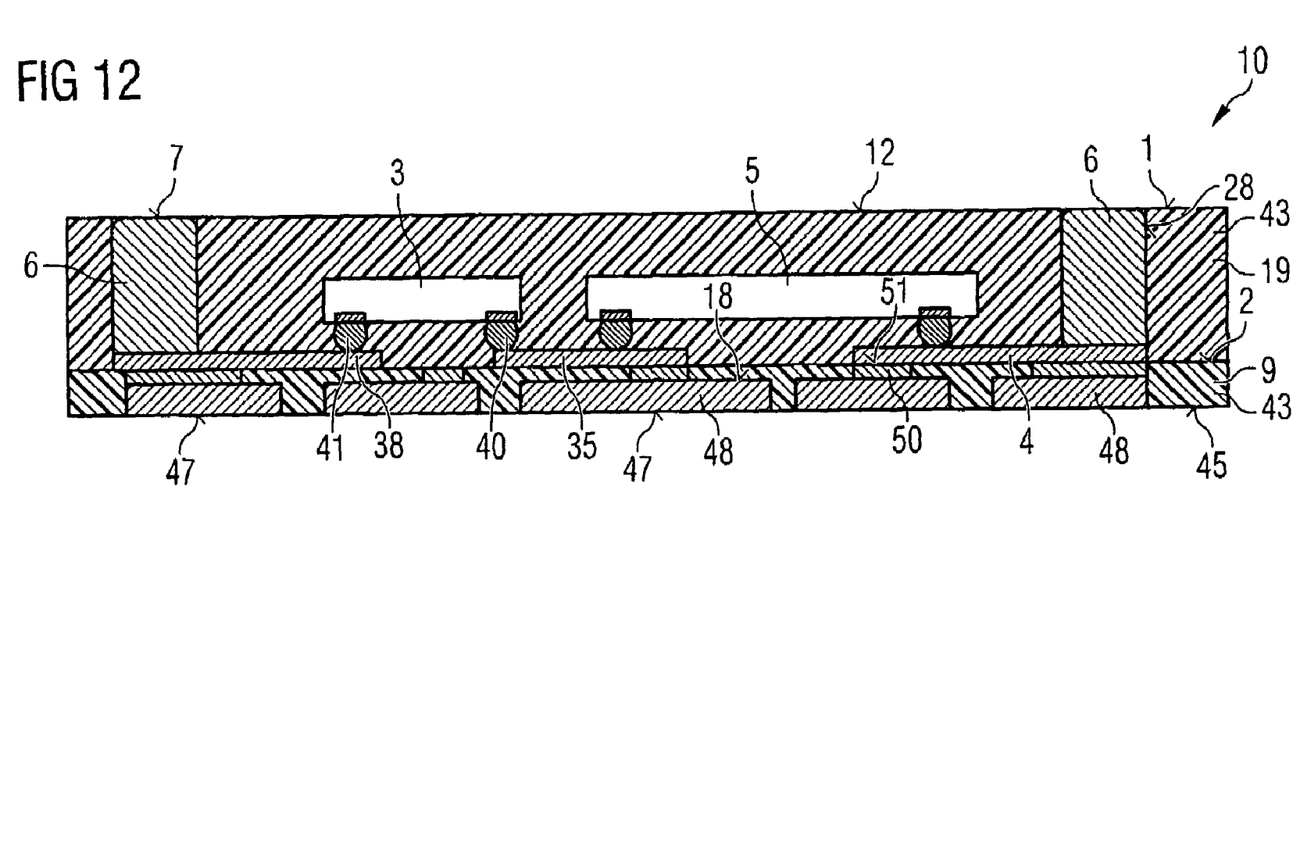
FIG. 12 shows a schematic cross section through a semiconductor module after application of a second layer of plastic.

FIG. 12 shows a schematic cross section through a semiconductor module 11 after applying a second layer of plastic 19. This second layer of plastic 19 comprises an epoxy resin, which is either dispensed onto the first layer of plastic 9 or molded onto this first layer of plastic 9. In this case, the height of the contact pieces 6 extending through the package ensures secure embedding of the semiconductor chips 3 and 5 in the plastic molding compound 43. At the same time, with the aid of the contact pieces 6 extending through the package, a first coplanar upper side 1 is created from the upper side 7 of the contact pieces 6 extending through the package and the upper side 12 of the second layer of plastic 19. Should plastic molding compound happen to be deposited on the upper side 7 of the contact pieces 6 extending through the package during dispensing or molding, a contact extending through the layer can also be applied by laser evaporation of the plastic and subsequent application of a further metal compound, such as a solder compound, to the upper side 7 of the contact pieces 6 extending through the package.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. A semiconductor module, comprising:
   external contacts embedded in a first plastic layer such that an underside of the semiconductor module comprises external contact areas of the external contacts;
   layer-through contacts coupled to the external contacts and providing an electrical connection between the external contacts and an upper side of the first plastic layer;
   a wiring structure with wiring leads and contact terminal areas arranged on the upper side of the first plastic layer, the wiring structure being coupled to the external contacts via the layer-through contacts;
   a cavity;
   semiconductor chips being arranged in the cavity and having terminals arranged on the contact terminal areas of the wiring structure;
   a second plastic layer surrounding the cavity in which the semiconductor chips are arranged; and
   contacts that extend through the cavity from the wiring structure to an upper side of the second plastic layer.

2. The semiconductor module as claimed in claim 1, wherein the cavity is closed off by a covering that is fixed on the upper side of the second plastic layer, wherein the contacts are disposed along side walls of the cavity.

3. The semiconductor module as claimed in claim 2, wherein the covering and/or the first plastic layer of plastic comprises a transparent region that is aligned with respect to a sensitive side of a sensor chip.

4. The semiconductor module as claimed in claim 2, wherein one of the side walls comprises a step having a contact terminal area that is connectable to a contact area of an active upper side of one of the semiconductor chips in the cavity via a bonding connection.

5. The semiconductor module as claimed in claim 1, wherein the semiconductor chips comprise flip-chip contacts that are arranged on the contact terminal areas.

6. The semiconductor module as claimed in claim 5, further comprising:
   a covering fully enclosing the cavity, wherein at least one of the contacts extends continuously through the cavity from the covering to the wiring structure and provides an electrical connection between the cover and the flip-chip contacts.

7. The semiconductor module as claimed in claim 6, wherein the flip-chip contacts are accessible from the external contacts on the underside of the semiconductor module and from the covering on a topside of the semiconductor module.

8. The semiconductor module as claimed in claim 1, wherein the semiconductor chips comprise contact areas on their active upper sides and bonding wires extend from the contact areas to the contact terminal areas.

9. The semiconductor module as claimed in claim 1, further comprising:
   additional plastic layers surrounding semiconductor chips, the additional plastic layers being arranged in a stack with the first and second plastic layer; and
   additional wiring structures respectively arranged between surfaces of adjacent plastic layers in the stack.

10. The semiconductor module as claimed in claim 9, further comprising a plurality of contact pieces respectively extending through the additional plastic layers and arranged in a column one on top of the other to form contacts extending through the semiconductor module.

11. A panel comprising semiconductor module positions with semiconductor modules according to claim 1 arranged in rows and columns.

12. The semiconductor module as claimed in claim 1, wherein at least one of the contacts extends continuously through the cavity from the wiring structure to an upper side of the semiconductor module.

13. The semiconductor module as claimed in claim 1, further comprising:
   a covering closing off the cavity and being configured to connect with a potential via one of the contacts extending through the cavity.

14. The semiconductor module as claimed in claim 13, wherein the potential is ground potential.

15. The semiconductor module as claimed in claim 1, wherein at least one of the contacts extends continuously along a sidewall of the cavity from the wiring structure to an upper end of the cavity.

16. The semiconductor module as claimed in claim 1, wherein the cavity is a fully enclosed cavity.

17. The semiconductor module as claimed in claim 1, wherein at least one of the contacts extends continuously along an entire height of the cavity.

18. The semiconductor module as claimed in claim 1, wherein at least one of the semiconductor chips includes a contact area on an active upper side opposite to a side having the flip-chip contacts, wherein at least one of the contacts extending through the cavity is coupled to the contact area on the active upper side of the at least one of the semiconductor chips via a bonding wire.

* * * * *